United States Patent
Tench et al.

(10) Patent No.: US 6,989,084 B2
(45) Date of Patent: Jan. 24, 2006

(54) SEMICONDUCTOR WAFER PLATING CELL ASSEMBLY

(75) Inventors: D. Morgan Tench, Camarillo, CA (US); John T. White, Lancaster, CA (US)

(73) Assignee: Rockwell Scientific Licensing, LLC, Thousand Oaks, CA (US)

( * ) Notice: Subject to any disclaimer, the term of this patent is extended or adjusted under 35 U.S.C. 154(b) by 501 days.

(21) Appl. No.: 10/012,079

(22) Filed: Nov. 2, 2001

(65) Prior Publication Data

US 2003/0085118 A1 May 8, 2003

(51) Int. Cl.
*C25D 7/12* (2006.01)
*C25D 17/00* (2006.01)

(52) U.S. Cl. .................................. 204/275.1
(58) Field of Classification Search ............... 205/13.3, 205/148, 157, 123; 204/275.1, 224 R
See application file for complete search history.

(56) References Cited

U.S. PATENT DOCUMENTS

| | | | |
|---|---|---|---|
| 3,616,396 A | * | 10/1971 | Swanson .................... 204/181 |
| 4,885,142 A | * | 12/1989 | Suitor et al. ................. 423/219 |
| 5,100,517 A | * | 3/1992 | Starinshak et al. .......... 205/138 |
| 5,256,274 A | * | 10/1993 | Poris ........................... 205/123 |
| 5,514,258 A | * | 5/1996 | Brinket et al. .............. 204/237 |
| 6,033,540 A | * | 3/2000 | Kosaki et al. ............... 204/284 |
| 6,284,108 B1 | * | 9/2001 | DiFrancesco ........... 204/224 R |
| 6,540,899 B2 | * | 4/2003 | Keigler ........................ 205/118 |

OTHER PUBLICATIONS

Lowenheim, Frank, "Electroplating", 1978, McGraw-Hill Book Co, pp. 12-13.*

* cited by examiner

*Primary Examiner*—Roy King
*Assistant Examiner*—Harry D. Wilkins, III

(57) ABSTRACT

A new cell assembly for semiconductor wafer electroplating in the plated-side-up configuration utilizes a narrow passageway around the perimeter of the wafer through which solution is forced so as to provide the laminar flow needed for effective Damascene copper plating. In addition, use of a cylindrical insulating cell wall whose inside diameter matches that of the wafer area being plated avoids overplating of the wafer periphery. Anode isolation in a compartment separated via a solution transport barrier prevents introduction of particulates and holds anolyte in place during wafer changes. This cell assembly is readily amendable to automated wafer plating.

23 Claims, 3 Drawing Sheets

SEMICONDUCTOR WAFER PLATING CELL ASSEMBLY

CROSS-REFERENCE TO RELATED APPLICATIONS

This application is related to an application of Greg Davis, Alex Moffatt, D. Morgan Tench and John T. White entitled "Improved Semiconductor Wafer Plating Cathode Assembly, which is being filed on the same date as this application, application Ser. No. 10/012,081.

BACKGROUND OF THE INVENTION

1. Field of the Invention

This invention is concerned with electroplating of semiconductor wafers, and in particular with the formation of copper integrated circuits (IC's) on semiconductor chips.

2. Related Prior Art

The electronics industry is in the process of transitioning from aluminum to copper as the basic metallization for semiconductor IC's. The higher electrical conductivity of copper reduces resistive losses and enables the faster switching needed for future generations of advanced devices. Copper also has a higher resistance to electromigration than aluminum.

The leading technology for fabricating copper circuitry on semiconductor chips is the "Damascene" process (see, e.g., P. C. Andricacos, Electrochem. Soc. Interface, Spring 1999, p. 32; U.S. Pat. No. 4,789,648 to Chow et al.; and U.S. Pat. No. 5,209,817 to Ahmad et al.). In this process, vias are etched through and trenches are etched in the chip's dielectric material, which is typically silicon dioxide, although materials with lower dielectric constants are desirable. A barrier layer, e.g., titanium nitride (TiN) or tantalum nitride (TaN), is first deposited into the trenches and vias by reactive sputtering to prevent Cu migration into the dielectric material and degradation of the device performance. Next, a thin copper seed layer is deposited by sputtering to provide the enhanced conductivity and good nucleation needed for copper electrodeposition. Copper is then electrodeposited into the trenches and vias. Excess copper deposited over the trenches and vias and in other areas (called the "overburden") is removed by chemical mechanical polishing (CMP). The "dual Damascene" process involves deposition in both trenches and vias at the same time. As used in this document, the general term "Damascene" also encompasses the dual Damascene process.

Damascene electroplating is generally performed on full silicon wafers, which are disks typically 8 inches (200 mm) in diameter and 0.03 inches (0.75 mm) thick. The industry trend is toward wafers of even larger diameters. Currently available wafer plating equipment employs a cathode assembly that includes a metallic backing plate, an insulating plastic housing, and a special metallic ring that makes electrical contact to the copper seed layer around the perimeter of the "plated" side of the wafer, i.e., the side of the wafer that is electroplated with copper. A concentric gasket (or o-ring) of smaller diameter is used to form a seal between the wafer plated-side surface and the plastic housing so as to prevent intrusion of the plating solution into the contact area and to the non-plated side of the wafer (opposite to the plated side). During plating, the electrolyte is pumped through at least one tubular nozzle directed at the wafer surface to provide bath agitation. The wafer is typically plated in the plated-side-down configuration and the cathode assembly is rotated to enhance the rate and uniformity of solution flow across the wafer surface.

Currently available wafer plating systems are cumbersome to automate and do not provide the highly uniform copper deposition across the wafer surface needed to provide the highest quality copper in trenches and vias and to minimize CMP processing time. A key problem is that the gasket or o-ring used to form a seal to the wafer requires a reasonably thick mechanical support structure which protrudes past the wafer plated surface, impeding solution flow and causing nonuniform copper deposition. To accommodate the electrical contact assembly and protective plastic housing, the plating tank is made substantially larger in diameter than the wafer plated area so that the wafer perimeter tends to be overplated because of the additional current path through the additional plating solution. Complicated baffles and shields are used in conjunction with cathode rotation to improve copper plating uniformity but these increase the complexity and expense of automation and do not provide optimum plating results. In addition, the requirement of cathode rotation is more easily fulfilled by exposing the wafer to the solution in the plated-side-down configuration for which trapping of bubbles within fine trenches and vias is a problem.

There is a critical need for an improved wafer plating system that operates in the plated-side-up configuration, provides adequate solution flow over the wafer surface, and prevents overplating of the wafer perimeter. Such an assembly would be valuable in providing more uniform Damascene copper plating and reducing costs for both the wafer plating operation and the subsequent CMP process.

Such an improved wafer plating system could also provide similar advantages for other wafer plating processes. For example, solder bumps for flip chip attachment are often fabricated by electroplating tin-lead solder on wafer pads exposed through a photoresist mask. The pads are electrically interconnected by a metallic seed layer (often gold but other metals are used), which is subsequently removed from non-pad areas of the wafer by wet chemical etching. Typically, the whole wafer is immersed in the plating tank and electrical contact to the seed layer on the wafer plated side is established via spring-loaded, plastic-shielded wires at a few points (usually three). Overplating of pads near the wafer edge is suppressed by use of plastic shielding in the plating solution. It is important that approximately the same amount of solder be plated on all pads within a given IC chip so that the solder balls are sufficiently uniform in height to be coplanar with the flip chip attachment pads on the substrate. As the trend toward IC chip miniaturization continues and solder balls decrease in volume, the requirement for solder plating uniformity across the wafer is becoming more stringent. Even if the coplanarity requirement within individual chips is met, too much solder in the balls can cause bridging that shorts the device. On the other hand, too little solder can result in structurally unsound solder joints because of inadequate underfill in the narrow space available, diminished distance over which stresses caused by thermal expansion mismatches can be relieved, and/or solder joint embrittlement induced by excessive volume fraction of gold contamination from seed or barrier layers. Consequently, there is an increasing need for a wafer plating system enabling pads on wafers to be plated with equivalent amounts of solder.

SUMMARY OF THE INVENTION

This invention is a cell assembly for electroplating semiconductor wafers in the plated-side-up configuration. The cell itself has an insulating wall (preferably cylindrical) with a narrow passageway near the cell wall bottom that is immediately above and at a low angle to the plane of the horizontal wafer surface (at least near the inside of the cell). Solution forced into the cell through this narrow passageway flows in a uniform sheet across the plated surface of the wafer, rises near the wafer center, and exits through an overflow passageway (e.g., a slot or plurality of holes) at the top of the cell. With a low-profile cathode assembly (for example, as described in the related application Ser. No. 10/012,081 entitled "Improved Semiconductor Wafer Plating Cathode Assembly", which was filed at the same time as the present application), this approach provides the laminar flow that is ideal for Damascene wafer plating. In addition, the inside diameter of the cylindrical cell wall is preferably matched to the diameter of the wafer area to be plated so that overplating of the wafer perimeter is avoided. The counter electrode is preferably in a separate compartment connected to the main cell via a solution transfer barrier comprised of ultra-fine porous insulating material (e.g., microporous glass). Solution circulated through the anode compartment is preferably filtered to remove particulates generated at the anode so as to prevent contamination of the catholyte. Cathode rotation can be used to provide better solution transport symmetry but this is not necessary if the passageway through which the solution flows is sufficiently uniform around the periphery of the wafer. This system is readily amenable to automatic wafer plating and operates in the plated-side-up configuration so that trapping of air within fine IC features is readily avoided.

These figures are not to scale and some features have been enlarged for better depiction.

DESCRIPTION OF THE INVENTION

This invention is a wafer plating cell assembly utilizing forced solution flow through a small passageway immediately above the plane of the wafer plated surface and outside the plated area to provide laminar solution flow toward the center of the wafer. Such laminar flow is ideal for the Damascene process since it tends to minimize agitation within trenches and vias so that the additive depletion required for bottom-up filling is attained. On the other hand, good solution flow across the wafer surface effectively replenishes organic additives so that plating is minimized above the trenches and vias and at other areas on the surface. Relatively uniform solution flow is provided by this invention since losses in solution momentum and flow rate are compensated by the reduction in area as the solution flows toward the center of the wafer. However, solution flow need not be highly uniform if it is adequate over the entire plated area to avoid significant additive depletion at the outside wafer surface. In a preferred embodiment of the present invention, the cell diameter is matched to the diameter of the plated area so that overplating of the wafer perimeter caused by extraneous current paths is avoided.

Figure 1:
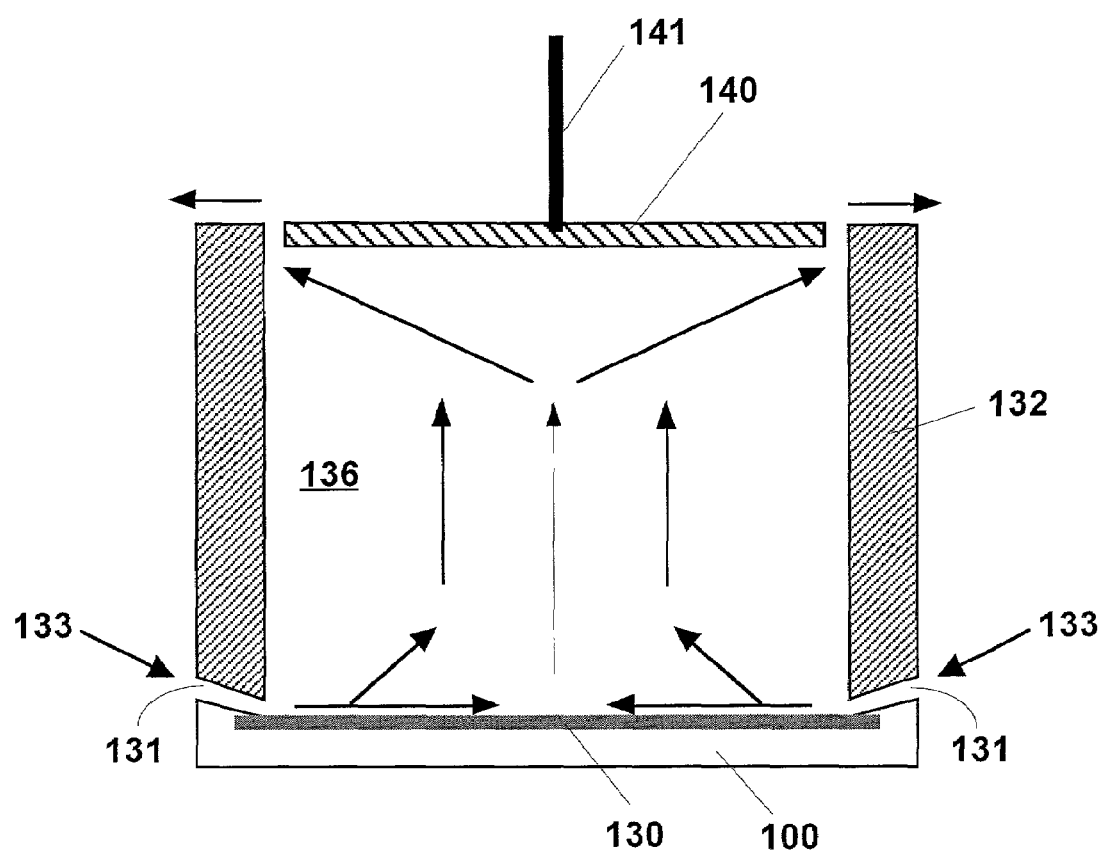
FIG. 1 is a cross-sectional schematic representation of a wafer plating system according to the present invention.

FIG. 1 illustrates the basic elements of the invention. A cathode assembly 100 holds a wafer 130 in a horizontal position and contains an electrical contact to the periphery of the wafer plated-side surface, which is the upper surface, as well as appropriate seals to prevent intrusion of plating solution. Typically, the periphery of the upper surface of the cathode assembly serves as the bottom of a solution injection passageway 131; this surface is preferably at a small angle relative to the plane of the wafer to promote laminar solution flow over the wafer surface. The bottom surface of cell wall 132 (which is preferably cylindrical) typically serves as at least a portion of the top of passageway 131. As indicted by the arrows 133, plating solution forced through passageway 131 tends to flow laminarly across the surface of wafer 130, causing solution in cell compartment 136 (above wafer 130 and within cell wall 132) to flow upward and over the top edge of cell wall 132 (or through holes near the top of the cell wall). Cell wall 132 is preferably fabricated of insulating material (e.g., plastic or glass) or is insulated from the solution (e.g., via a polymer coating) so that current flow within cell wall 132 is substantially prevented. In this case, overplating of the wafer periphery can be avoided by matching the inside diameter of cell wall 132 to the diameter of the wafer area being plated (see FIG. 1).

Solution injection passageway 131 in FIG. 1 can have various configurations and can be formed in various ways. The simplest arrangement is for passageway 131 to be defined by parallel surfaces of the top of cathode assembly 100 and the bottom of cell wall 132 but the passageway can be formed wholly or partly by other structures attached to the cathode assembly and/or the cell wall. Passageway 131 is preferably continuous around the periphery of wafer 130 but may also be segmented or may comprise small holes or slots in tubes, nozzles or otherwise continuous material. Furthermore, passageway 131 may be tapered or have a non-linear cross-section as long as the solution is caused to impinge on the wafer surface at a sufficiently small angle to avoid turbulence at the flow rate used. A passageway with a flared cross-section at the wafer side may be advantageous to attain a relatively high rate of laminar flow. Solution can be forced to flow through passageway 131 by use of a pump, gravity feed, gas pressure, or other means.

The dimensions and shape of passageway 131 are preferably chosen to provide adequate solution flow for the particular size wafer and current density used for plating. Higher solution flow rates would typically be required for larger wafer diameters and higher current densities but flow rates high enough to cause turbulence should be avoided. A passageway in the form of an unobstructed smooth slot at a low angle to the plane of the wafer provides high laminar flow capability. In general, the passageway should be relatively narrow (less than 1 mm width in cross section) to avoid turbulence at higher flow rates and to avoid the need for excessive solution pumping capacity or pressure. Note that a very thin sheet of solution moving parallel across the wafer surface is adequate for replenishment of the solution species which are consumed at the cathode. On the other hand, it may be difficult to fabricate a relatively narrow passageway with sufficiently uniform cross-sectional width to provide uniform solution flow over the wafer surface. Passageways in the form of a continuous slot of relatively uniform cross-sectional width in the 0.5 to 1.0 mm range have been found to be preferable.

Cathode assembly 100 in FIG. 1 can be fabricated from plastic but is preferably comprised of a metal having an insulating polymer coating to prevent plating on areas of its surface that contact the plating solution. Such an assembly is described in the related application Ser. No. 10/012,081 entitled "Improved Semiconductor Wafer Plating Cathode Assembly", which was filed at the same time as the present application. Use of a polymer-coated metal for the cathode assembly facilitates establishing electrical contact and provides the material strength needed to minimize protrusion of the assembly above the wafer plated-side surface. A low profile for cathode assembly 100 enables solution impingement on the wafer surface at a low angle to provide laminar flow at higher flow rates.

Anode 140 in FIG. 1 is preferably a disk of anode metal having an outside diameter comparable to the inside diameter of cell wall 132, which is preferably cylindrical. This ensures a constant resistive path through the solution to all points on the surface of wafer 130, thereby ensuring uniform copper plating. The anode surface area can be reduced by removing material (e.g., providing holes) or increased by texturing the surface, depending on the cathode/anode area ratio required for a given plating bath formulation. The anode may also be provided in the form of shot or pellets of the anode metal held in an anode basket of an inert metal (e.g., titanium) that also serves as the current collector. Particulate material generated at the anode can be contained by use of anode bags or a separate anode compartment. Electrical contact to anode 140 may be established by anode contact 141, which typically is a metal rod attached via screw threads or welding. Note that an inert anode material could be used but an anode of the metal being plated is preferred so that ions consumed at the cathode are replaced by dissolution of the anode and the overall solution composition remains practically constant. Use of inert anodes would also result in generation of detrimental solvent breakdown products (e.g., peroxide) and rapid consumption of organic additives by anodic oxidation. For Damascene copper plating, the preferred anode is copper, typically containing additional elements (e.g., sulfur or phosphorous) that promote anodic copper dissolution.

Figure 2:
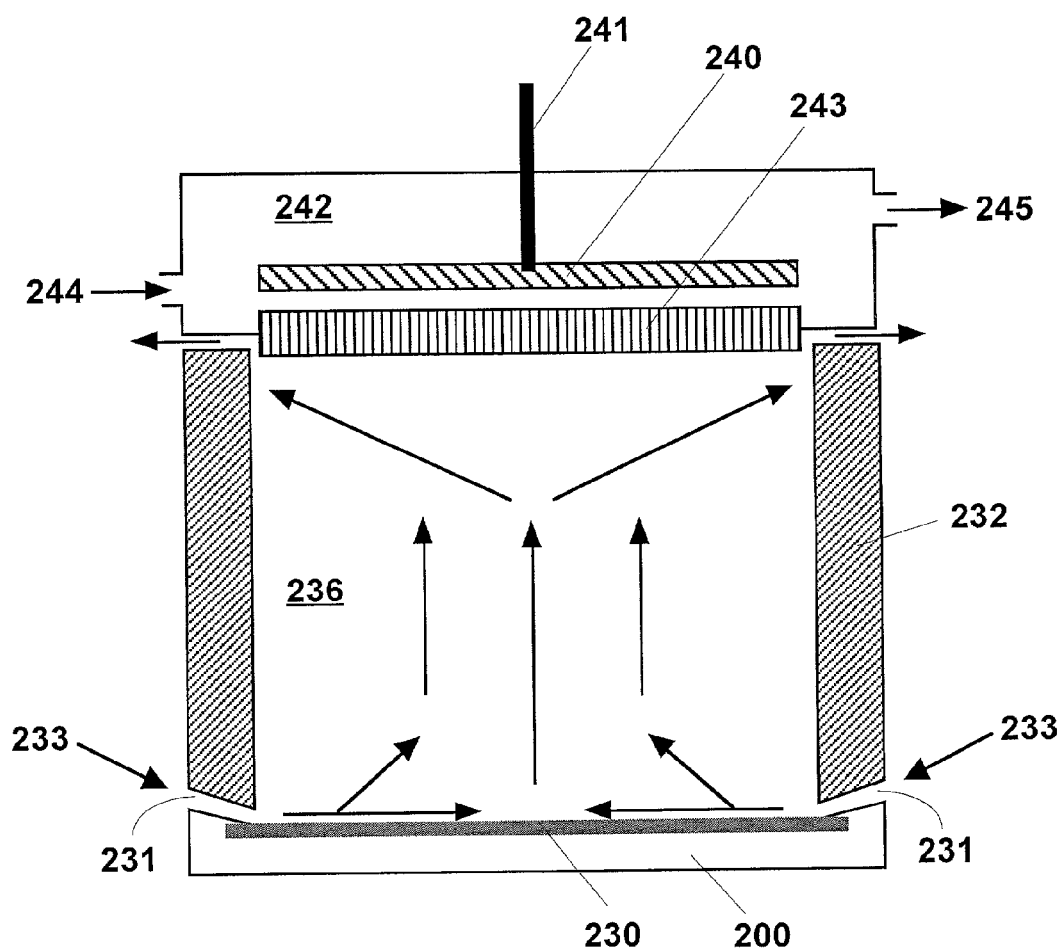
FIG. 2 is a cross-sectional schematic representation of a wafer plating system with a separate anode compartment according to the present invention.

FIG. 2 illustrates a wafer plating system similar to that in FIG. 1 but including a separate anode compartment 242, containing anode 240 and anolyte solution, which is electrically connected to the catholyte solution in main cell compartment 236 (defined by cell wall 232, wafer 230 and the bottom of anode compartment 242) via a solution transport barrier 243. The latter is attached to anode compartment 242 using appropriate sealing means (e.g., o-rings or gaskets). Anode compartment 242 should be made of an insulating material (e.g., plastic, glass or ceramic) compatible with the plating solution under operating conditions.

Solution barrier 243 may be comprised of an ion conducting membrane or a porous insulating material (e.g., plastic, glass or ceramic frit) in the form of a substantially continuous sheet or multiple discrete elements. One function of solution barrier 243 is to minimize intrusion of anolyte into the main cell compartment 236 when it is drained of catholyte (and rinsed with water) to effect removal/insertion of wafers. A solution barrier of relatively high electrical resistance also provides the equivalent of a large anode to cathode separation so that uniform metal deposition can be obtained over the surface of wafer 230 with a small volume of catholyte, which increases wafer plating throughput by decreasing the time required for filling and draining the catholyte. In addition, isolation of anode 240 in anode compartment 242 obviates the need for an anode bag to contain particulates generated during dissolution of the anode. This greatly facilitates cell maintenance and periodic replacement of the anode, which is normally consumed during operation.

Preferably, the anolyte and catholyte are comprised of the same plating solution recirculated from a common reservoir (not shown in FIG. 2) so as to maintain a constant metal ion concentration. Solution may be circulated through anode compartment 242 via inlet 244 and outlet 245. A parallel rather than a series solution flow system for main cell compartment 236 and anode compartment 242 is preferred since the solution recirculation rate required for the anolyte is relatively small. A single pump can be used, with a portion of the solution flow being diverted to inlet 244 of anode compartment 242. The anolyte should be filtered to remove particulates before being returned to the solution reservoir. For acid copper sulfate plating systems, the anolyte flow rate should be such that the copper anode surface state ("anode film") needed to avoid excessive additive consumption is formed and maintained.

A preferred material for solution barrier 243 is microporous glass (e.g., Vycor® "Thirsty Glass", manufactured by Corning), which provides good electrical connection between electrolytes but allows negligible solution flow over the time frame typically involved in wafer plating and exchange. Such material is available as sheets, disks or rods. The latter may be cut to a length providing the optimum electrical resistance and pressed into holes in the bottom of anode compartment 242, preferably fitted with o-rings (made of rubber material, for example) to prevent leakage. If multiple discrete solution barriers are used, they should be spaced closely and evenly over the bottom of the anode compartment so as to provide uniform metal deposition over the surface of wafer 230.

The cell assembly of the present invention can be applied to practically any wafer electroplating process, including those used for Damascene copper IC fabrication and solder bumping. Any wafer material, including silicon, germanium, silicon-germanium and gallium arsenide, can be plated using the assembly.

Preferred Embodiment

Figure 3:
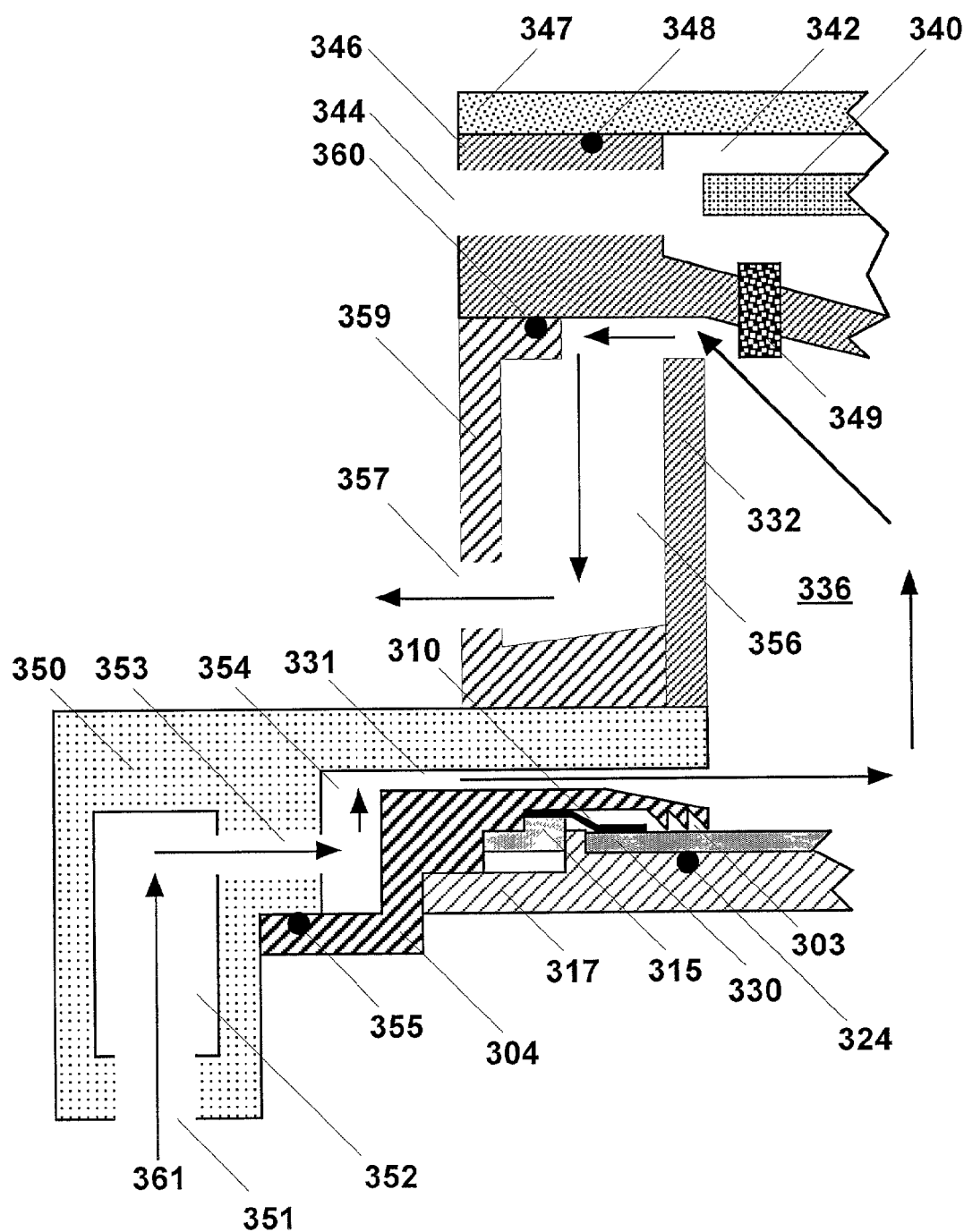
FIG. 3 is a cross-sectional view of one side of a cell assembly illustrating a preferred embodiment of the present invention employing a low profile cathode assembly.

FIG. 3 illustrates a preferred embodiment of the present invention employing a low-profile cathode assembly, a continuous solution injection passageway (flared on the wafer end), an insulating cell wall of the same inside diameter as the diameter of the wafer plated area, an anode compartment separated by a solution transport barrier, and an integral system for recirculating plating solution.

The low-profile cathode assembly, which is described in detail in the related application Ser. No. 10/012,081 entitled "Improved Semiconductor Wafer Plating Cathode Assembly", comprises a structural metal ring 304, an electrical contact ring 310, a contact pressure ring 315, and a backing plate 317. Structural ring 304 has a sawtooth cross section in the area of seal 303 to concentrate applied seal force and provide redundancy for improved sealing, and has a sloping inside rim on the side opposite seal 303 that protrudes minimally above the surface of wafer 330. Although not shown in FIG. 3, seal 303 and other areas of structural ring 304 that contact the plating solution during operation are coated with a thin layer of an adherent polymer (e.g., polytetrafluoroethylene). This polymer coating provides a good seal to the plated-side surface of wafer 330 and electrically insulates the metal against extraneous electroplating that would otherwise occur. Electrical contact is made via a metallic contact ring 310 having fingers that press against the plated-side side perimeter of wafer 330. Contact ring 310 is held in place by contact pressure ring 315, which is attached directly to structural ring 304 (e.g., via a plurality of machine screws). The periphery of wafer 330 is pressed against seal area 303 and the fingers of contact ring 310 by o-ring 324 on backing plate 317, which may be attached to structural ring 304 (e.g., via a plurality of machine screws). In some cases, o-ring 324, which serves to distribute forces that might otherwise break the wafer, may not be needed. For an automated plating system, backing plate 317 may serve as a wafer carrier that is not directly attached to structural ring 304 but robotically moves the wafer against the seal and holds it in place during plating. In this case, a clamping device or vacuum system may be used to secure the wafer so that the carrier can be rotated after retraction from the cathode assembly to remove plating solution and rinse water.

Solution injection passageway 331 is formed by the top of structural ring 304 and a portion of the solution inlet manifold 350, including that which is defined by the lower portion of cell wall 332. This passageway has a uniform thickness of about 1 mm except for the flared area on the inside, which is designed to ensure laminar flow over the wafer surface. Note that placing the weld joint between inlet manifold 350 and the bottom edge of cell wall 332 within the cell wall rather than inlet passageway 331, avoids the possibility that this joint will disrupt solution flow within the passageway. In this document, reference to the cell wall also includes any portion comprised of the inlet manifold or another part.

As indicated by the series of arrows 361, solution from a reservoir (not shown) is forced into inlet manifold 350 through at least one inlet hole 351, which is connected to a continuous ring-shaped channel 352 that feeds solution through numerous radial holes 353 into another ring-shaped channel 354 supplying solution to passageway 331. Contact between structural ring 304 and inlet manifold 350 precisely defines the cross-sectional width of solution injection passageway 331 and forms the bottom of ring-shaped channel 354, which is sealed by o-ring 355 (or a gasket). Structural ring 304 may be attached to inlet manifold 350 (via a plurality of machine screws, for example) or be held in place by another mechanical device (not shown). Note that solution injection passageway 331 is continuous, having no obstructions that would disturb solution flow. Ring-shaped channel 354 uniformly distributes solution to passageway 331. Plating solution within cell compartment 336 flows over the top of cell wall 332 and is collected in ring-shaped channel 356 before being returned to the reservoir via outlet hole 357 (which is connected to a tube or pipe).

Anode compartment 342 is contained within bottom part 346, which is sealed along its bottom edge to the top rim of outer cylinder 359 either permanently or via o-ring 360 (as shown) and fasteners, e.g., a plurality of machine screws (not shown). This compartment preferably has a removable lid 347 (attached via a plurality of machine screws, for example) sealed with o-ring 348 (or a gasket) to provide access to anode 340 for maintenance and replacement. Anode 340 is preferably a disk of approximately the same diameter as the inside of cell wall 332 and is positioned parallel with the surface of wafer 330 so as to provide the constant anode-cathode spacing conducive to uniform electroplating. Electrical contact to anode 340 is preferably provided by a threaded metallic rod (not shown) attached and sealed to lid 347 so as to provide the rigidity needed to maintain the anode position. Solution is forced to flow through anode compartment 342 via inlet hole 344 and a similar exit hole (not shown). The electrolyte barrier is preferably provided by microporous glass rods 349 press-fitted into o-rings in holes in bottom part 346. Rods 349 should be evenly spaced over the surface of wafer 330 and of equal length so as to provide constant resistive paths from the anode to all points on the wafer surface. It is convenient to use glass rods that are about 0.25 inch (6 mm) in diameter and about 0.5 inch (13 mm) long. The bottom surface of bottom part 346 is preferably sloped slightly upward (5° to 10°) from the center towards the perimeter to minimize trapping of air bubbles that might adversely affect the current distribution.

The wafer plating cell assembly of the present invention can be fabricated using almost any plastic material (or combination of materials) that is stable in the plating solution under operating conditions. Plastics that can readily be machined and solvent-welded are preferred for ease of fabrication. In addition, inlet manifold 350 and structural ring 304 should be sufficiently rigid and should not deform at the operating temperature so that solution injection passageway 331 remains uniform and constant in cross-sectional width. A preferred plastic material is Plexiglas®, which is also transparent so that operation of the cell assembly can be visually monitored.

Stainless steel is a preferred metal for fabricating structural ring 304 since it has the high strength needed for fabrication of stiff structures of minimum cross section. It also resists corrosion that could result from plating bath or rinse water contact, either directly or via pores in the polymer coating. The metal used for the electrical contact ring is not critical but preferably has good elasticity to provide spring-loading of the contact, and good resistance to oxidation and corrosion in the vicinity of and/or contact with the plating solution. Most metals have adequate conductivity. Preferred contact metals are stainless steel and beryllium copper but many others would be acceptable.

Although a variety of polymer materials can be used to provide the adherent coating needed for structural ring 304, halocarbon polymers are particularly well suited for this application since they are chemically inert and very hydrophobic, and tend to be relatively soft and compliant. Polytetrafluoroethylene (PTFE), i.e., Teflon®, is a preferred coating material but other halocarbon polymers, e.g., polytrifluorochloroethylene (Kel-F®), have similar properties. Very thin PTFE coatings applied by thermal spraying are highly adherent to stainless steel (and other metals). For improved seal performance and to suppress electroplating through pinholes, the PTFE coating can be thickened by multiple applications. A PTFE coating 0.003 to 0.005 inch thick (approximately 0.1 mm) is effective. Various halocarbons may be mixed or combined with other polymers for ease of application or to attain a desired property, e.g., low porosity. Since most organic polymers tend to be hydrophobic and reasonably soft, any polymer material that is stable in the electroplating bath and can be applied as an adherent, conformal coating might provide acceptable results. A wide variety of o-ring/gasket materials having acceptable chemical resistance are available.

EXAMPLES

Wafer Plating Assembly Fabrication

The assembly depicted in FIG. 3 was fabricated and shown to be efficacious for Damascene copper plating of eight-inch silicon wafers. The inside diameter of cell wall 332 was 7.50 inches (191 mm), which was the same as the wafer plated area. All parts for inlet manifold 350, main cell compartment 336 and outer cylinder 359 were machined from Plexiglas® material and were chemically welded together to form a monolithic structure having an overall diameter of 15.0 inches (38 cm). There were four 0.75-inch diameter inlet holes 351 having a total cross-sectional area of 1.77 in$^2$ (11.4 cm$^2$). The sides of channel 352 were about 7.0 and 6.3 inches from the center of the wafer so that the cross-sectional area perpendicular to the solution flow direction was about 30 in$^2$ (190 cm$^2$). There were twenty-four 0.375-inch radial holes 353 having a total cross-sectional area of 2.6 in$^2$ (17 cm$^2$). The sides of channel 354 were about 5.2 and 4.9 inches from the center of the wafer so that the cross-sectional area perpendicular to the solution flow direction was about 10 in$^2$ (65 cm$^2$). Slot 331 had a minimum thickness of 0.030 inch (0.76 mm) at a distance of about 7.9 inches so that the minimum cross-sectional area of 0.74 in$^2$ (4.8 cm$^2$). Main cell compartment 336 had a minimum height of 4.5 inches (11 cm) and a solution volume of approximately 3.3 liters.

Anode compartment bottom part 346 and lid 347 were fabricated from polypropylene and had a rubber o-ring seal. Anode 340 was a copper disk (6.0 inches diameter) with a copper contact rod (0.25 inch diameter) threaded into its center. The anolyte-catholyte solution barrier was comprised of ninety-one rods 349 of Thirsty Glass® (Corning) that were 0.25 inch (6 mm) in diameter and 0.50 inch (13 mm) in length). Rods 349 were spaced evenly about 0.63 inch (16 mm) apart over the bottom of anode compartment 342, which was sloped at an angle of 10° from its center to the edge of the cell wall.

For the cathode assembly, structural ring 350, contact pressure ring 315 and backing plate 317 were fabricated from 304 stainless steel. The seal area of structural ring 304 had three concentric circular sawtooth ridges 0.030 inch (0.75 mm) high and 0.025 inch (0.63 mm) apart. The ridges were slightly rounded, having a radius of curvature of about 0.003 inch (0.08 mm). The protrusion above the wafer surface increased from 0.030 inch (0.75 mm) at the inside perimeter to 0.14 inch (3.5 mm) with a constant slope of 15° relative to the wafer surface. A commercial polymer coating comprised of one layer of Dupont® PTFE primer (baked at 370° C.) and three layers of Dupont® PFEP (baked at 340° C.) was applied (by Stamar Engineering Co., South Gate, Calif.) to the seal and all other areas exposed to the plating bath during operation. The total thickness of the coating was 0.003 inch (0.08 mm) to 0.004 (0.1 mm) thick. Contact ring 310 was made of beryllium-copper alloy and was 0.005 inch (0.13 mm) thick, 8.15 inches (20.7 cm) o.d. and 0.766 inches (19.4 cm) i.d. overall (when flat). Fingers approximately 0.13-inch (3.2 mm) square and 0.13-inch (3.2 mm) apart were machined on the inside of the contact rings and were bent (in a custom fixture) so as to contact the wafer perimeter when installed in the cathode assembly.

Backing plate 317 was attached to the piston on an air cylinder (not shown) so that wafer 330 could be conveniently raised, held in place during plating, and lowered after plating. A good seal was formed at a cylinder pressure of 15 pounds per square inch (psi).

Rubber o-rings were used for all seals except the seal to the wafer plated side. All fasteners were 304 stainless steel machine screws in threaded holes.

EXAMPLES

Wafer Plating

In the cell assembly fabricated, both eight-inch wafers and 304 stainless steel disks of the same dimensions were electroplated from a copper pyrophosphate plating bath (operated at 55° C. and pH 8.3). The bath contained 65.6 g/L copper pyrophosphate, 317 g/L potassium pyrophosphate, 2.1 g/L ammonia ($NH_3$), 12 g/L potassium nitrate and 2.0 ppm 2,5-dimercapto-1,3,4-thiadiazole as an organic additive. Uniform plating was indicated by a uniform color change for very thin copper layers over the surface of stainless steel cathodes, and by successful CMP processing of wafers.

The preferred embodiments of this invention have been illustrated and described above. Modifications and additional embodiments, however, will undoubtedly be apparent to those skilled in the art. Furthermore, equivalent elements may be substituted for those illustrated and described herein, parts or connections might be reversed or otherwise interchanged, and certain features of the invention may be utilized independently of other features. Consequently, the exemplary embodiments should be considered illustrative, rather than inclusive, while the appended claims are more indicative of the full scope of the invention.

What is claimed is:

1. A cell assembly for electroplating a semiconductor wafer using an electroplating solution, comprising:
   an anode;
   a cathode assembly for making electrical contact to the wafer and for holding the wafer in a substantially horizontal position;
   a seal between the cathode assembly and the wafer to prevent the solution from intruding into the region of electrical contact between the cathode assembly and the wafer;
   a cell wall; and
   a passageway disposed around the periphery of the wafer, such that the electroplating solution, when forced through said passageway into the cell assembly, is caused to flow laminarly over the upper surface of the wafer, toward the center of the wafer, and then upward within said cell wall.

2. The cell assembly of claim 1, wherein said anode comprises the same metal that is electroplated on the wafer.

3. The cell assembly of claim 1, further comprising a solution transport barrier between the anode and the wafer, thereby defining an anolyte compartment containing said anode and a catholyte compartment containing said wafer.

4. The cell assembly of claim 3, wherein said solution transport barrier comprises microporous glass.

5. The cell assembly of claim 1, wherein said cathode assembly comprises a metallic structural ring having a seal area and a polymer coating covering at least a portion of the seal area.

6. The cell assembly of claim 5, wherein said structural ring has a ridge in the seal area.

7. The cell assembly of claim 5, wherein the inside edge of said structural ring is reduced in thickness.

8. The cell assembly of claim 5, wherein said structural ring is substantially circular in shape and substantially concentric with said wafer.

9. The cell assembly of claim 5, wherein said polymer coating includes a polymerized halocarbon compound.

10. The cell assembly of claim 1, further comprising a backing plate that moves the wafer and holds it in place against the seal while electroplating is performed.

11. The cell assembly of claim 1, wherein said electrical contact comprises a thin metallic electrical contact ring having fingers that press against the wafer surface.

12. The cell assembly of claim 1, wherein the inside surface of said cell wall is cylindrical in shape and has an inside diameter equivalent to the diameter of the wafer area to be plated.

13. The cell assembly of claim 1, wherein the top of said passageway is defined by the bottom surface of said cell wall.

14. The cell assembly of claim 1, wherein the bottom of said passageway is at least partially defined by a portion of the top surface of said cathode assembly.

15. The cell assembly of claim 1, wherein said passageway comprises a plurality of slots.

16. The cell assembly of claim 1, wherein said passageway comprises a plurality of holes.

17. The cell assembly of claim 1, wherein said passageway has a uniform cross-sectional width.

18. The cell assembly of claim 1, wherein said passageway is flared on one end, such that the cross-sectional area of the passageway increases toward that end.

19. The cell assembly of claim 1, wherein said passageway has a non-linear cross section.

20. The cell assembly of claim 1, wherein said cell wall comprises an electrically insulating material.

21. The cell assembly of claim 20, wherein said electrically insulating material is selected from the group consisting of polymers, ceramics and mixtures thereof.

22. A cell assembly for electroplating a semiconductor wafer using an electroplating solution, comprising:
   an anode;
   a cathode assembly for making electrical contact to the wafer and for holding the wafer in a substantially horizontal position,
      said cathode assembly including an electrically conducting structural ring, an insulating coating over a portion of said structural ring, an electrical contact to the wafer, and a seal to prevent the solution from intruding into the region of electrical contact between the cathode assembly and the wafer;
   a cell wall; and
   a passageway or plurality of passageways disposed around the periphery of the wafer, such that the electroplating solution, when forced through said passageway or passageways into the cell assembly, is caused to flow laminarly over the upper surface of the wafer, toward the center of the wafer, and then upward within said cell wall.

23. A cell assembly for electroplating a semiconductor wafer, comprising:
   an anode;
   a cathode assembly for making electrical contact to the wafer and for holding the wafer in a substantially horizontal position,
      said cathode assembly including an electrically conducting structural ring, an insulating coating over a portion of said structural ring, an electrical contact to the wafer, and
   a seal to prevent the solution from intruding into the region of electrical contact between the cathode assembly and the wafer;
   a cylindrical cell wall that has substantially the same inside diameter as the area of the wafer to be electroplated; and
   a passageway or plurality of passageways disposed around the periphery of the wafer, such that the electroplating solution, when forced through said passageway or passageways into the cell assembly, is caused to flow laminarly over the upper surface of the wafer, toward the center of the wafer, and then upward within said cell wall.

* * * * *